United States Patent
Nishimura et al.

(10) Patent No.: US 8,748,064 B2
(45) Date of Patent: Jun. 10, 2014

(54) CHARGED PARTICLE BEAM DRAWING METHOD AND CHARGED PARTICLE BEAM DRAWING APPARATUS

(75) Inventors: Rieko Nishimura, Kawasaki (JP); Satoshi Nakahashi, Yokohama (JP)

(73) Assignee: NuFlare Technology, Inc., Numazu-shi (JP)

( * ) Notice: Subject to any disclaimer, the term of this patent is extended or adjusted under 35 U.S.C. 154(b) by 28 days.

(21) Appl. No.: 13/606,888

(22) Filed: Sep. 7, 2012

(65) Prior Publication Data
US 2013/0065184 A1    Mar. 14, 2013

(30) Foreign Application Priority Data

Sep. 9, 2011 (JP) ................................. 2011-197489

(51) Int. Cl.
*G03F 1/44* (2012.01)
*G03F 7/20* (2006.01)

(52) U.S. Cl.
CPC ................ *G03F 1/44* (2013.01); *G03F 7/2063* (2013.01); *Y10S 430/143* (2013.01)
USPC .................. 430/5; 430/30; 430/296; 430/942

(58) Field of Classification Search
CPC .................................. G03F 1/44; G03F 7/2063
USPC ................... 430/5, 30, 296, 942; 250/492.21, 250/492.22, 396 R
See application file for complete search history.

(56) References Cited

U.S. PATENT DOCUMENTS

| 7,834,333 B2 | 11/2010 | Nishimura et al. |
| 2010/0288939 A1 | 11/2010 | Nishimura |

FOREIGN PATENT DOCUMENTS

JP    2008-71986    3/2008

*Primary Examiner* — Christopher Young
(74) *Attorney, Agent, or Firm* — Oblon, Spivak, McClelland, Maier & Neustadt, L.L.P.

(57) ABSTRACT

A charged particle beam drawing method according to an embodiment is a method including forming a first measurement pattern in a first measurement pattern area; in succession with processing of forming the first measurement pattern, forming a second measurement pattern in a second measurement pattern area located farthest from the first measurement pattern area in the same column as the first measurement pattern area; and in moving a charged particle beam from the second measurement pattern area to a third measurement pattern area located adjacent to the first measurement pattern area in the same column as the first and second measurement patterns to form a third measurement pattern, moving the charged particle beam to the third measurement pattern area while taking tiny shots approximately equivalent to a data resolution at the adjacent measurement pattern areas to be drawn in the same column one after another from the second measurement pattern.

18 Claims, 11 Drawing Sheets

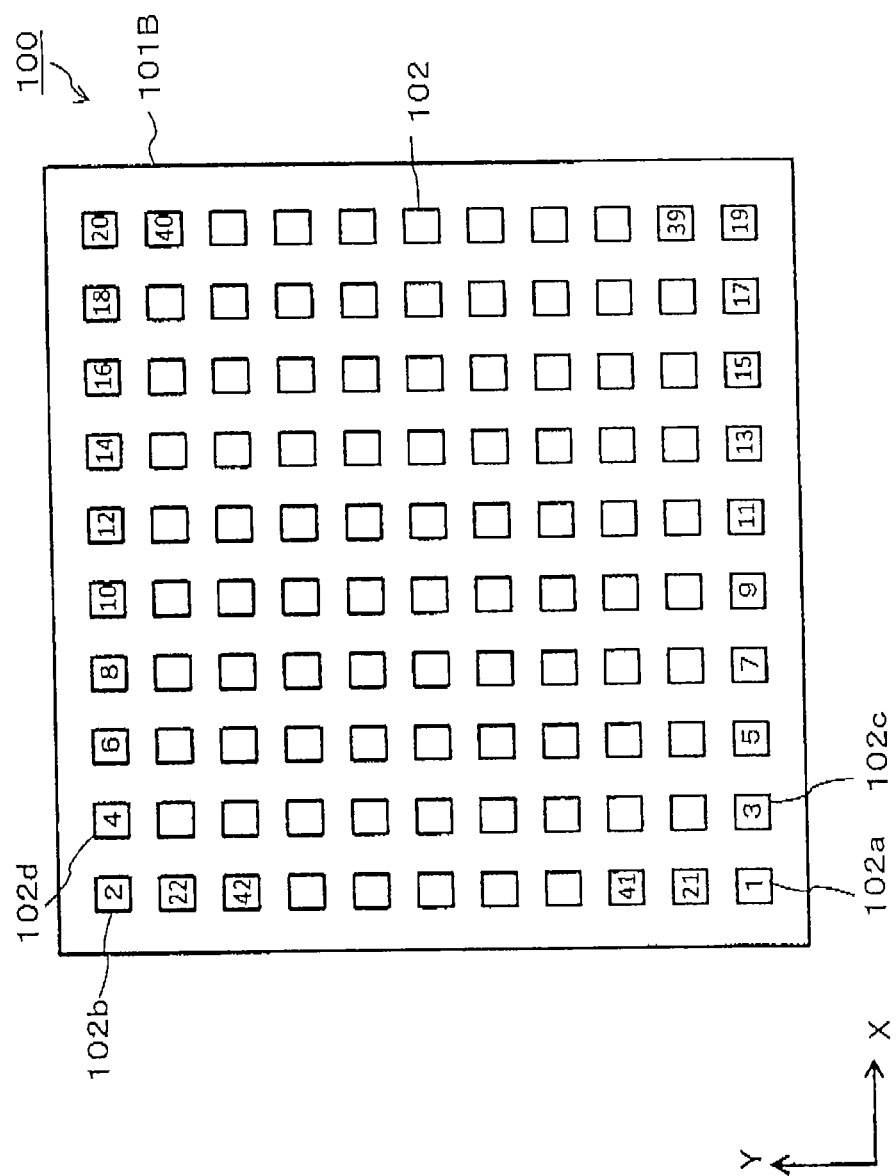

CHARGED PARTICLE BEAM DRAWING METHOD AND CHARGED PARTICLE BEAM DRAWING APPARATUS

CROSS-REFERENCE TO THE RELATED APPLICATION

This application is based on and claims the benefit of priority from Japanese Patent Application No. 2011-197489, filed on Sep. 9, 2011; the entire contents of which are incorporated herein by reference.

FIELD

Embodiments relate to a charged particle beam drawing method and a charged particle beam drawing apparatus.

BACKGROUND

A lithography technique is used to form a desired circuit pattern in a semiconductor device, and a pattern transfer using an original pattern called a mask (a reticle) is performed in the lithography technique. For this technique, an electron beam drawing technique exhibiting excellent resolutions is used to manufacture a reticle with high precision.

One of methods for a charged particle beam drawing apparatus configured to perform the electron beam drawing on the reticle is a variable shaped beam method as below. Specifically, although not illustrated herein, in the variable shaped beam method is a method in which a pattern is drawn on a workpiece placed on a movable stage by using an electron beam shaped through first and second shaping apertures.

Here, by using two stages of main and sub deflectors for positioning a beam on a substrate by deflection, the pattern drawing process is performed in each of stripe fields into which a drawing region on the substrate is divided in a strip form. The stripe field has a width in which the main deflector can position the beam by deflection. Further, when each stripe field is drawn, the drawing is performed in each of sub-deflection fields into which the strip field is divided in a mesh form. The sub-deflection field has a size in which the sub deflector can position the beam by deflection. The aforementioned stripe width and the sub-field have been made smaller and smaller, as techniques for higher precision and further miniaturization have been advanced in recent years.

The increase of the number of the stripes and the downsizing of the sub-fields along with the downsizing of the width of each stripe influence the drawing accuracy. Correction in the sub-deflection areas is described in Japanese Patent Application Publication No. 2011-066236.

In addition, the above trends are also influencing settling in main deflection fields. The settling in the main deflection fields has conventionally been performed in the following manner, for example. Specifically, FIG. 9 shows a part of an evaluation substrate 100 used for measuring position errors required in calculation of settling conditions in main deflection fields 101. FIG. 9 particularly shows one main deflection field 101 in an enlarged manner.

The evaluation substrate 100 has measurement patterns 102 drawn thereon which are used to measure position errors. In FIG. 9, the measurement patterns 102 are shown in squares and drawn at 10 positions in an X direction and at 11 positions in a Y direction, that is, at 110 positions in total in the one main deflection field 101. Here, the number of measurement patterns to be drawn in one main deflection field can be set to any number.

In the main deflection field 101 shown in FIG. 9, the first measurement pattern is drawn in the lower left corner, and then the measurement patterns are drawn one after another in the Y direction at regular intervals, as shown by solid line arrows. After a line of the main deflection field 101 in the Y direction is full of the drawn measurement patterns, the charged particle beam moves to the lower right (an XY stage having the evaluation substrate 100 placed thereon moves), so that the measurement patterns are again drawn in the Y direction.

By performing such drawing, the settling condition is calculated based on the position errors in the drawing using the charged particle beam in cases where the charged particle beam moves in a long distance (moves to the lower right for the next column after completion of the drawing of all the measurement patterns in one column), and in contrast in a short distance (moves to draw the measurement patterns in the same column in the Y direction).

However, the main deflection settling explained by using FIG. 9 described above could be made even with higher accuracy in terms of the following point.

Specifically, the method of drawing measurement patterns shown in FIG. 9 can obtain measurement data of only two distances of the long and short moving distances of the charged particle beam. As a matter of course, data of various distances can be analogically obtained based on the measurement data of the two distances, and thus the settling condition can be calculated actually. However, when highly accurate main deflection settling is also required as described above, the measurement data of only the long and short distances might be insufficient to calculate the settling condition.

Hence, employment of the following method is conceivable as the method of drawing measurement patterns. FIGS. 10 and 11 are exemplary diagrams for explaining methods of drawing measurement patterns different from the drawing method shown in FIG. 9, and respectively show the drawing methods different from each other. Numbers indicating the order of the drawing are put in the squares of some of the measurement patterns 102.

In FIG. 10, the drawing of the measurement patterns 102 is started at the lower left corner of a main deflection field 101A. After a measurement pattern 102A denoted by the number 1 is drawn, a measurement pattern 1028 denoted by the number 2 is drawn in an area farthest from the measurement pattern 102A in the same column. After the measurement pattern 102B is drawn, a measurement pattern 102C which is adjacent to the measurement pattern 102A and denoted by the number 3 is drawn.

As described above, in the main deflection field 101A shown in FIG. 10, the drawing start position is set to a measurement pattern closest to a corner. Next, the drawing is performed in a drawing area located farthest from the drawn measurement pattern in the same column. As the result, the drawing is performed back and forth in the same column in the Y direction, that is, in the order of the assigned numbers in FIG. 10. After the measurement patterns are drawn in all the areas set in the same column, the drawing is performed in the next column in the same manner.

In contrast, the drawing method shown in FIG. 11 uses the same drawing start position as the method described by using FIG. 10 in the drawing start position but is different in the order of drawing. Specifically, in a main deflection field 101B shown in FIG. 11, the drawing is started at a measurement pattern 102a located in the lower left corner of the main field 101E and denoted by the number 1. Next, a measurement pattern 102b denoted by the number 2 is drawn. Further, the subsequent drawing is performed at a position (a measurement pattern 102c denoted by the number 3) located adjacent to the measurement pattern 102a in the same column as the measurement pattern 102a denoted by the number 1. After the measurement pattern 102c is drawn at the position denoted by the number 3, the drawing is performed at a position (a measurement pattern 102d denoted by the number 4) located farthest from the measurement pattern 102c in the same column as the measurement pattern 102c. This position is located adjacent to the measurement pattern 102b in the same column as the measurement pattern 102b.

The drawing is continued in the X direction as described above until none of the measurement patterns 102 is left for the drawing. Then, the charged particle beam returns to the column including the measurement pattern 102a, and the drawing is performed in the next line in the same manner, starting at a measurement pattern 102 denoted by the number 21.

Employment of the method shown in FIG. 10 or 11 makes it possible to evaluate the settling not only in the long and short distances but also in the various distances, and thus to calculate a highly accurate settling condition through the evaluations.

Nevertheless, the methods shown in FIGS. 10 and 11 can calculate the settling condition in the various distances, but are considered to have another inconvenience. Specifically, in either of the methods, the charged particle beam firstly moves in the long distance to perform the drawing, and then the moving distance required for the drawing is gradually made shorter. In this case, a settling time might be insufficient in the start stage of the drawing. In consideration of this, the drawing progresses successively while being in short of the settling time. As a result, the drawing is performed in a position displacement state attributable to the insufficient settling time. This prevents accurate evaluation.

BRIEF DESCRIPTION OF THE DRAWINGS

FIG. 11 is an exemplary diagram for explaining the order of drawing measurement patterns in a main deflection filed in a conventional technique.

DETAILED DESCRIPTION

Figure 1:
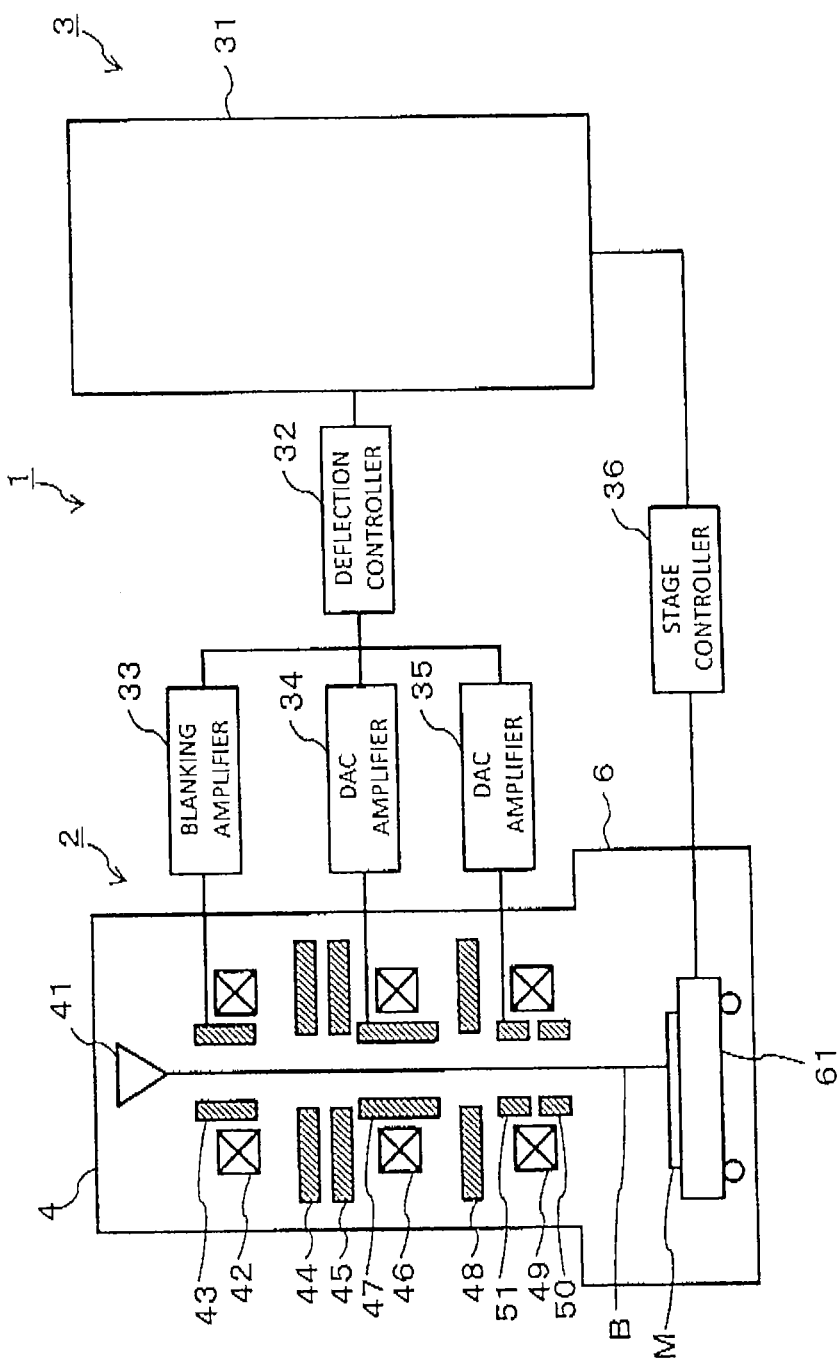
FIG. 1 is a block diagram showing an overall configuration of a charged particle beam drawing apparatus in embodiments of the present invention.

According to one embodiment, a charged particle beam drawing method is a charged particle beam drawing method for drawing measurement patterns on a mask based on control data outputted from a storage unit, the mask having multiple stripes set therein, the stripes each having multiple main deflection fields in each of which N×M measurement patterns are to be formed respectively in multiple measurement pattern areas. The charged particle beam drawing method includes the steps of: forming a first measurement pattern in a first measurement pattern area; in succession with processing of forming the first measurement pattern, forming a second measurement pattern in a second measurement pattern area located farthest from the first measurement pattern area in the same column as the first measurement pattern area; and in moving a charged particle beam from the second measurement pattern area to a third measurement pattern area located adjacent to the first measurement pattern area in the same column as the first and second measurement patterns to form a third measurement pattern, moving the charged particle beam to the third measurement pattern area while taking tiny shots approximately equivalent to a data resolution at the adjacent measurement pattern areas to be drawn in the same column one after another from the second measurement pattern.

According to another embodiment, a charged particle beam drawing method is a charged particle beam drawing method for drawing measurement patterns on a mask based on control data outputted from a storage unit, the mask having multiple stripes set therein, the stripes each having multiple main deflection fields in each of which N×M measurement patterns are to be formed respectively in multiple measurement pattern areas. The charged particle beam drawing method includes the steps of: forming a first measurement pattern in a first measurement pattern area; in succession with processing of forming the first measurement pattern, forming a second measurement pattern in a second measurement pattern area located farthest from the first measurement pattern area in the same line as the first measurement pattern area; and in moving a charged particle beam from the second measurement pattern area to a third measurement pattern area located adjacent to the first measurement pattern area in the same line as the first and second measurement patterns to form a third measurement pattern, moving the charged particle beam to the third measurement pattern area while taking tiny shots approximately equivalent to a data resolution at the adjacent measurement pattern areas to be drawn in the same line one after another from the second measurement pattern.

According to another embodiment, a charged particle beam drawing method is a charged particle beam drawing method for drawing measurement patterns on a mask based on control data outputted from a storage unit, the mask having multiple stripes set therein, the stripes each having multiple main deflection fields in each of which N×M measurement patterns are to be formed respectively in multiple measurement pattern areas. The charged particle beam drawing method includes the steps of: forming a first measurement pattern in a first measurement pattern area; in succession with processing of forming the first measurement pattern, forming a second measurement pattern in a second measurement pattern area located farthest from the first measurement pattern area in the same column as the first measurement pattern; and in moving a charged particle beam from the second measurement pattern area to a third measurement pattern area located in a column adjacent to the first and second measurement patterns, and located adjacent to the first measurement pattern area in the same line as the first measurement pattern, moving the charged particle beam from the second measurement pattern to a certain one of the measurement pattern areas to be drawn located in the adjacent column and moving the charged particle beam to the third measurement pattern area while taking tiny shots approximately equivalent to a data resolution at the adjacent measurement pattern areas in the same column one after another from the certain measurement pattern area.

According to another embodiment, a charged particle beam drawing method is a charged particle beam drawing method for drawing measurement patterns on a mask based on control data outputted from a storage unit, the mask having multiple stripes set therein, the stripes each having multiple main deflection fields in each of which N×M measurement patterns are to be formed respectively in multiple measurement pattern areas. The charged particle beam drawing method includes the steps of: forming a first measurement pattern in a first measurement pattern area; in succession with processing of forming the first measurement pattern, forming a second measurement pattern in a second measurement pattern area located farthest from the first measurement pattern area in the same line as the first measurement pattern; and in moving a charged particle beam from the second measurement pattern area to a third measurement pattern area located in a line adjacent to the first and second measurement patterns, and located adjacent to the first measurement pattern area in the same column as the first measurement pattern, moving the charged particle beam from the second measurement pattern to a certain one of the measurement pattern areas to be drawn located in the adjacent line and moving the charged particle beam to the third measurement pattern area while taking tiny shots approximately equivalent to a data resolution at the adjacent measurement pattern areas in the same line one after another from the certain measurement pattern area.

According to another embodiment, a charged particle beam drawing method is a charged particle beam drawing method for drawing measurement patterns on a mask based on control data outputted from a storage unit, the mask having multiple stripes set therein, the stripes each having multiple main deflection fields in each of which N×M measurement patterns are to be formed respectively in multiple measurement pattern areas. The charged particle beam drawing method includes the steps of: forming a first measurement pattern in a first measurement pattern area; in succession with processing of forming the first measurement pattern, forming a second measurement pattern in a second measurement pattern area located farthest from the first measurement pattern area in the same column as the first measurement pattern area; and in moving a charged particle beam from the second measurement pattern area to a third measurement pattern area located in a column adjacent to the first and second measurement patterns and located adjacent to the first measurement pattern area in the same line as the first measurement pattern, moving the charged particle beam while taking tiny shots approximately equivalent to a data resolution at the adjacent measurement pattern areas in the same column as the first and the second measurement pattern areas one after another from the second measurement pattern area, and then, after taking a tiny shot at the measurement pattern area adjacent to the first measurement pattern in the same column as the first measurement pattern, shifting the charged particle beam by one column to the third measurement pattern in the next column from the measurement pattern area adjacent to the first measurement pattern.

According to another embodiment, a charged particle beam drawing method is a charged particle beam drawing method for drawing measurement patterns on a mask based on control data outputted from a storage unit, the mask having multiple stripes set therein, the stripes each having multiple main deflection fields in each of which N×M measurement patterns are to be formed respectively in multiple measurement pattern areas. The charged particle beam drawing method includes the steps of: forming a first measurement pattern in a first measurement pattern area; in succession with processing of forming the first measurement pattern, forming a second measurement pattern in a second measurement pattern area located farthest from the first measurement pattern area in the same line as the first measurement pattern area; and in moving a charged particle beam from the second measurement pattern area to a third measurement pattern area located in a line adjacent to the first and second measurement patterns and located adjacent to the first measurement pattern area in the same column as the first measurement pattern, moving the charged particle beam while taking tiny shots approximately equivalent to a data resolution at the adjacent measurement pattern areas in the same line as the first and the second measurement pattern areas one after another from the second measurement pattern area, and then, after taking a tiny shot at the measurement pattern area adjacent to the first measurement pattern in the same line as the first measurement pattern, shifting the charged particle beam by one line to the third measurement pattern in the next line from the measurement pattern area adjacent to the first measurement pattern.

According to another embodiment, a charged particle beam drawing apparatus includes: a drawing unit configured to draw a measurement pattern on a mask placed on a movable stage by using a charged particle beam; and a controller including a deflection controller configured to control deflection of the charged particle beam, a stage controller configured to control moving of the stage, and a control calculator configured to control the deflection controller and the stage controller. In the charged particle beam drawing apparatus, the controller further includes: an analyzer configured to analyze measurement data extracted from the measurement pattern drawn in a main deflection field in the mask; and a calculator configured to calculate an optimum settling condition by checking a position error of a shot of the charged particle beam based on a result of an analysis by the analyzer.

Various Embodiments will be described hereinafter with reference to the accompanying drawings.

First Embodiment

FIG. 1 is a block diagram showing an overall configuration of a charged particle beam drawing apparatus 1 in embodiments of the present invention. In the following embodiments, a configuration using an electron beam taken as an example of a charged particle beam will be described. The charged particle beam is not limited to the electron beam, and may be another beam using charged particles, such as an ion beam.

The charged particle beam drawing apparatus 1 is an apparatus configured to draw a certain pattern on a workpiece, and is particularly an example of a variable-shape drawing apparatus. As shown in FIG. 1, the charged particle beam drawing apparatus 1 mainly includes a drawing unit 2 and a controller 3. The drawing unit 2 includes an electron lens barrel 4 and a drawing chamber 6.

An electron gun 41, an illuminating lens 42, a blanking deflector 43, a blanking aperture 44, a first shaping aperture 45, a projection lens 46, a shaping deflector 47, a second shaping aperture 48, an objective lens 49, and position deflectors 50 and 51 which are main deflector 50, and a sub deflector 51 are arranged in the electron lens barrel 4. The illuminating lens 42, the blanking deflector 43, the blanking aperture 44, the first shaping aperture 45, the projection lens 46, the shaping deflector 47, the second shaping aperture 48, the objective lens 49, the main position deflector 50, and the sub deflector 51 are arranged in this order along an optical path of an electron beam B emitted from the electron gun 41.

In the drawing chamber 6, a stage 61 is arranged. A workpiece such as a mask on which a pattern is drawn is placed on the stage 61 during the drawing. Here, an evaluation substrate M is placed thereon.

The blanking deflector 43 includes multiple, for example, two or four electrodes. The shaping deflector 47, the main deflector 50, and the sub deflector 51 each include multiple, for example, four or eight electrodes. Although FIG. 1 shows that only one DAC amplifier is connected to each of the shaping deflector 47, the main deflector 50, and the sub deflector 51, but at least one DAC amplifier is connected to each electrode thereof. Incidentally, "DAC" of the DAC amplifier stands for "Digital to Analog Converter."

The controller 3 includes a control computation device 31, a deflection controller 32, a blanking amplifier 33, deflection amplifiers (DAC amplifiers) 34, 35 and a stage controller 36. The control computation device 31, the deflection controller 32, and the stage controller 36 are connected to each other via a bus not shown in FIG. 1. The deflection controller 32, the blanking amplifier 33, and the DAC amplifiers 34, 35 are connected to each other via a bus not shown in FIG. 1.

The blanking amplifier 33 is connected to the blanking deflector 43. The DAC amplifier 34 is connected to a shaping deflector 47. The DAC amplifier 35 is herein connected to the sub deflector 51 which is one of the position deflectors. The deflection controller 32 outputs independent digital control signals to the blanking amplifier 33 and the DAC amplifiers 34, 35, respectively. Each of the blanking amplifier 33 and the DAC amplifiers 34, 35 receiving the corresponding digital signal converts the digital signal into an analog voltage signal, amplifies the analog signal, and outputs the analog signal as a deflection voltage to the corresponding connected deflector. In this manner, each of the deflectors receives the deflection voltage applied from the corresponding connected DAC amplifier. The deflection voltage causes deflection of the electron beam.

Here, in the charged particle beam drawing apparatus 1, the shaping deflector 47, the main deflector 50, and the sub deflector 51 each having four or eight electrodes are arranged in such a manner as to surround the electron beam as described above. The electrodes are paired (two pairs in the case of the four electrodes or four pairs in the case of the eight electrodes), and each pair is arranged across the electron beam. The DAC amplifiers are connected to each of the shaping deflector 47, the main deflector 50, and the sub deflector 51. However, FIG. 1 shows only one DAC amplifier connected to a corresponding one of the shaping deflector 47, the main deflector 50, and the sub deflector 51 and does not show the other DAC amplifiers.

The stage controller 36 is connected to the stage 61 and the control computation device 31 and detects and controls the movement of the stage 61.

Figure 2:
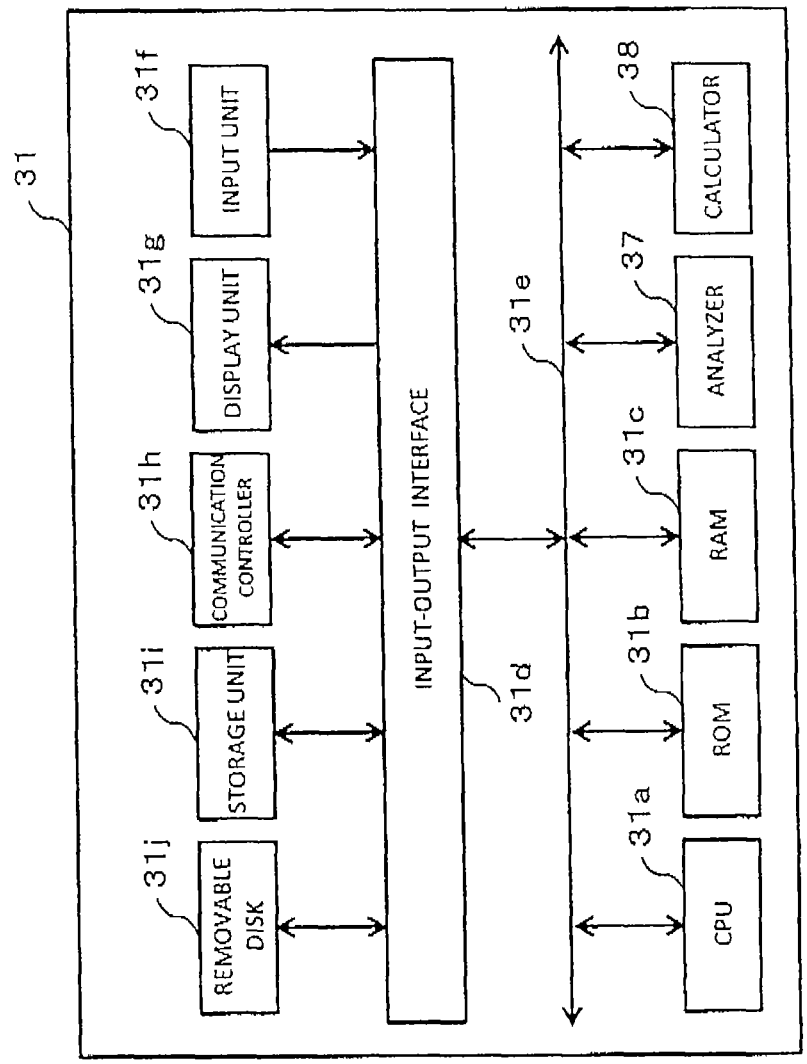
FIG. 2 is a block diagram showing an internal configuration of a control computation device in the embodiments of the present invention.

FIG. 2 is a block diagram showing an internal configuration of the control computation device 31 in the embodiments of the present invention. In the control computation device 31, a central processing unit (CPU) 31a, a read only memory (ROM) 31b, a random access memory (RAM) 31c, and an input-output interface 31d are connected to each other via a bus 31e. To the input-output interface 31d, an input unit 31f, a display unit 31g, a communication controller 31h, a storage unit 31i, and a removable disk 31j are connected. In addition, an analyzer 37 and a calculator 38 are connected to the aforementioned units via the bus 31e.

The CPU 31a executes a boot program for starting the charged particle beam drawing apparatus 1 by reading the program from the ROM 31b on the basis of an input signal from the input unit 31f, and reads various operating systems stored in the storage unit 31i. The CPU 31a also controls various devices on the basis of input signals from other external equipment which are not shown in FIG. 1. Further, the CPU 31a is a processor configured to read programs and data stored in the ROM 31b and the storage unit 31i to load the programs and the data onto the RAM 31c and configured to achieve a series of processing such as calculation and processing of data performed on the basis of commands of the program read from the ROM 31b.

The input unit 31f is formed by input devices such as a keyboard and a dial through which an operator of the charged particle beam drawing apparatus 1 inputs various operations. The input unit 31f generates an input signal based on the operation of the operator and transmits the signal to the CPU 31a via the bus 31e.

The display unit 31g is a liquid crystal display, for example. The display unit 31g receives an output signal from the CPU 31a via the bus 31e, and displays results of processing and the like by the CPU 31a, for example.

The communication controller 31h is means, such as a LAN card or a modem, which enables the charged particle beam drawing apparatus 1 to be connected to a communication network such as the Internet or a LAN. Data transmitted to or received from the communication network through the communication controller 31h is transmitted to or received from the CPU 31a as an input signal or an output signal through the input-output interface 31d and the bus 31e.

The storage unit 31i is formed by a semiconductor and a magnetic disk. The storage unit 31i stores therein layout data serving as a base of drawing data, the drawing data, programs executed by the CPU 31a, and data for the programs.

The removable disk 31j is an optical disk or a flexible disk. A signal read or written by a disk drive is transmitted to or received from the CPU 31a via the input-output interface 31d and the bus 31e.

The control computation device 31 has herein been described by taking an example in which the control computation device 31 is configured as hardware, but may be configured as software such as a program. Alternatively, the control computation device 31 may be configured by a combination of the hardware and the software. When the control computation device 31 is configured including the software as described above, input data to be inputted to the control computation device 31 or a computation result is always stored in, for example, a memory which is not shown in FIG. 1.

Further, FIG. 1 shows the charged particle beam drawing apparatus 1 in the embodiments of the present invention having the configuration only required to explain the embodiments of the present invention. Accordingly, another configuration such as a control circuit for controlling the lenses may be added thereto.

The charged particle beam drawing apparatus 1 operates in the following manner to perform drawing on a target. In a case where the blanking deflector 43 sets ON the electron beam B which is emitted from the electron gun 41 (an emission unit) and passes through the blanking deflector 43, the electron beam B is controlled to pass through the blanking aperture 44. On the other hand, when the blanking deflector 43 sets OFF the electron beam B, the entire electron beam B is deflected to be blocked by the blanking aperture 44. One shot of the electron beam B is generated by the passing of the electron beam B through the blanking aperture 44 in a period during which a deflection voltage from the blanking amplifier 33 is switched from OFF to ON and later ON to OFF.

The blanking amplifier 33 outputs the deflection voltage which alternately creates the state in which the electron beam B passes through the blanking aperture 44 and the state in which the electron beam B is blocked by the blanking aperture 44. Then, the blanking deflector 43 controls the direction of the passing electron beam B based on the deflection voltage outputted from the blanking amplifier 33 and thereby alternately creates the state in which the electron beam B passes through the blanking aperture 44 and the state in which the electron beam B is blocked by the blanking aperture 44.

As described above, the electron beam B is generated by passing through the blanking deflector 43 and the blanking aperture 44, and the illuminating lens 42 causes each shot of the electron beam B to illuminate the entire first shaping aperture 45 having an aperture of a square which is an oblong, for example. Here, the electron beam is firstly shaped into the rectangle which is the oblong, for example. Then, the electron beam B passing through the first shaping aperture 45 with a first aperture image is projected onto the second shaping aperture 48 by the projection lens 46. A deflection voltage for controlling the direction of the electron beam B passing through the first shaping aperture 45 is applied to the shaping deflector 47 by the DAC amplifier 34. This makes it possible to deflect and control the first aperture image on the second shaping aperture 48 and thus to change the beam shape and dimensions.

Deflection voltages for controlling an irradiation position of the electron beam B passing through the second shaping aperture 48 are outputted to the sub deflector 51 by the DAC amplifier 35 and to the main deflector 50 by the not shown DAC amplifiers, respectively. The electron beam B passing through the second shaping aperture 48 with a second aperture image is focused by the objective lens 49, and is emitted onto a desired position on the workpiece (the evaluation substrate M in the embodiments of the present invention) placed on the stage 61 controlled for successive moving by the stage controller 36.

Figure 3:
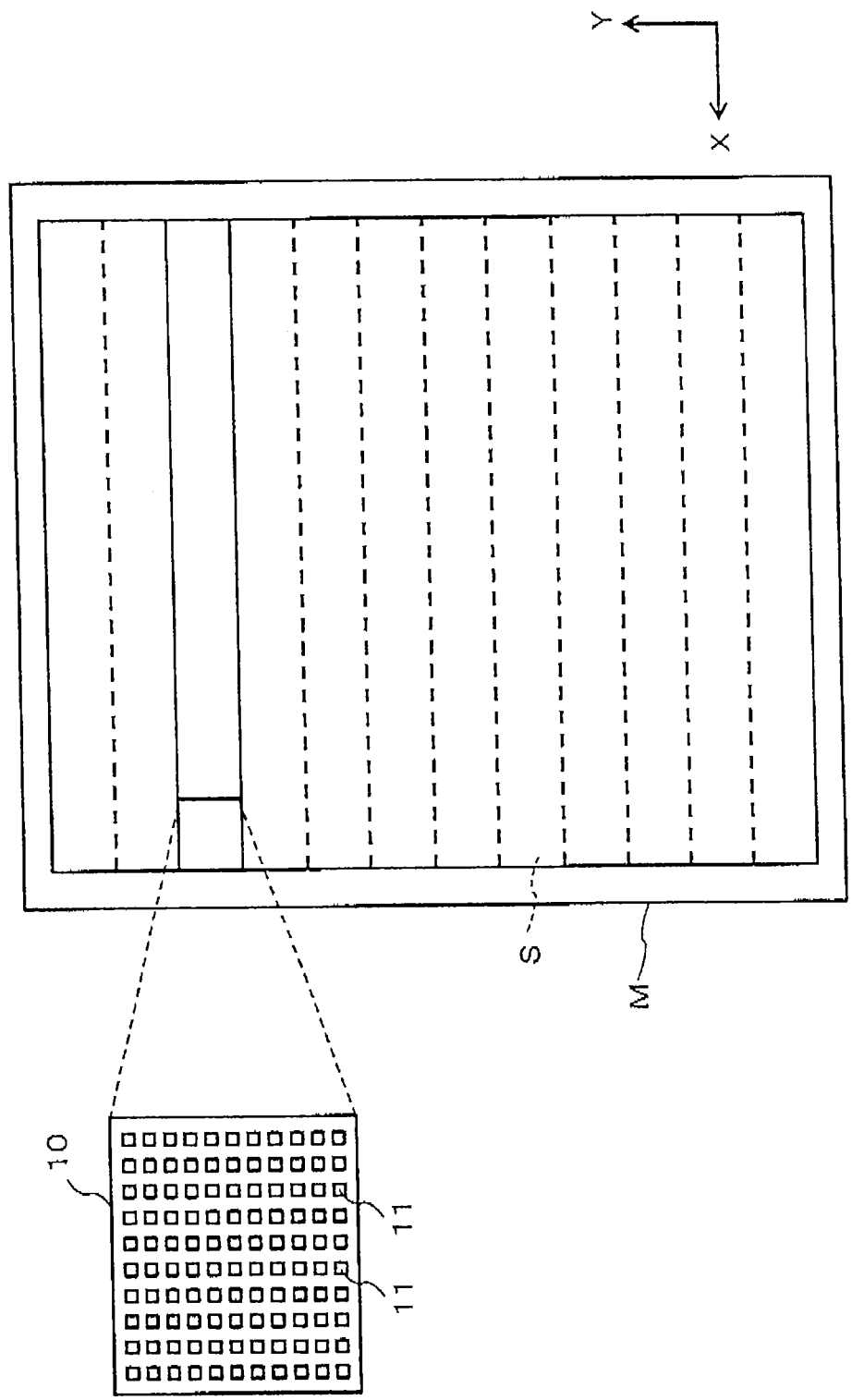
FIG. 3 is an exemplary diagram for explaining a relationship between an evaluation substrate and a main deflection field in the embodiments of the present invention.

FIG. 3 is an exemplary diagram for explaining a relationship between the evaluation substrate M and a main deflection field 10 in the embodiments of the present invention. In drawing a certain pattern by using the charged particle beam drawing apparatus 1, a drawing region of a drawing target workpiece which is a mask or an evaluation substrate, for example, is divided into multiple stripe-shaped unit drawing areas (stripes) S in the Y direction, for example, to have a width in which the main deflector 50 can position the beam by deflection, as shown in FIG. 3. Further, each stripe S is separated also in the X direction to have the same width, for example, as that of the stripe S in the Y direction. Each of the divided areas is the main deflection field 10 allowing the deflection of the main deflector 50. Incidentally, although not shown in FIG. 3, areas obtained by further sub-dividing the main deflection field 10 are sub-deflection areas (sub-fields).

Here, the main deflector 50 is used to control a position of each sub-deflection area in a range (the main deflection field 10) including the multiple sub-deflection areas. For this reason, in the drawing on the drawing target workpiece such as the mask or the evaluation substrate, displacement of a drawing position on the main deflection field 10 due to a beam drift, for example, needs to be corrected.

In the embodiments of the present invention, multiple measurement patterns 11 are drawn on the main deflection field 10 of the evaluation substrate M. Displacement of the drawing position of each measurement pattern 11 on the main deflection field 10 is measured based on a relationship between the drawing position and a moving distance of the charged particle beam B, and optimum settling for the main deflector 50 is calculated. Thereby, the charged particle beam drawing apparatus 1 is evaluated.

Figure 4:
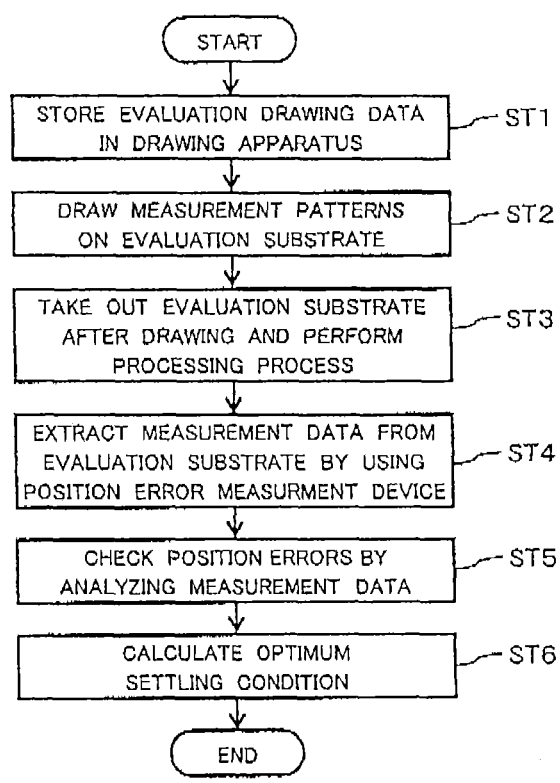
FIG. 4 is a flowchart showing a flow of an evaluation of a charged particle beam drawing apparatus in the embodiments of the present invention.

Next, concrete methods of evaluating the charged particle beam drawing apparatus 1 will be described based on a flowchart shown in FIG. 4 by appropriately using FIGS. 5 to 8. FIG. 4 is a flowchart showing a flow of an evaluation of a charged particle beam drawing apparatus 1 in the embodiments of the present invention.

In the first place, drawing data for evaluation is stored in the charged particle beam drawing apparatus 1 (the storage unit 31i in the control computation device 31) (ST1). The drawing data is used to draw the measurement pattern 11 on the evaluation substrate M. In storing the drawing data, for example, the drawing data may be directly inputted by the operator by using the input unit 31f, or may be read through the removable disk 31j.

Then, the measurement pattern 11 is drawn on the main deflection field 10 of the evaluation substrate M by using the drawing data (ST2). How to draw the measurement pattern 11 at this time will be described in the following two embodiments.

Figure 5:
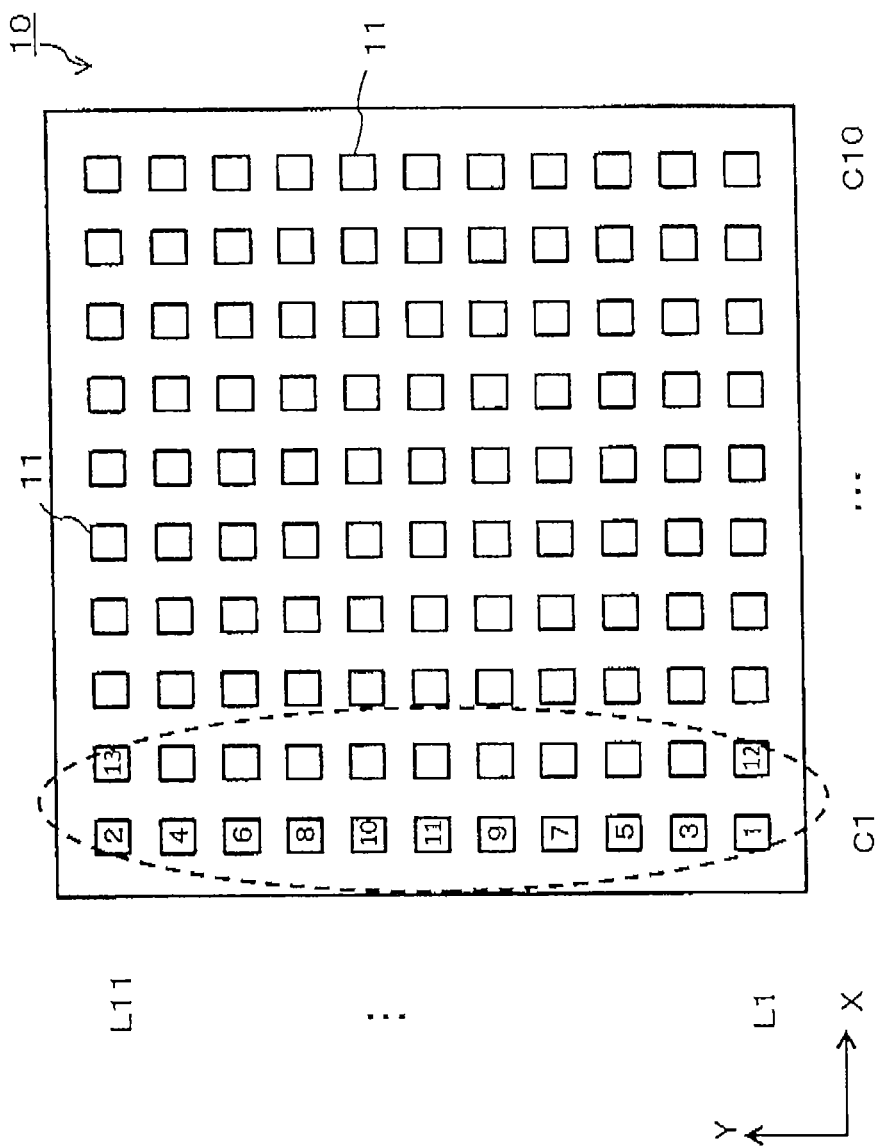
FIG. 5 is an exemplary diagram used in explaining a first evaluation method in a first embodiment of the present invention out of methods of evaluating a charged particle beam drawing apparatus.
Figure 6:
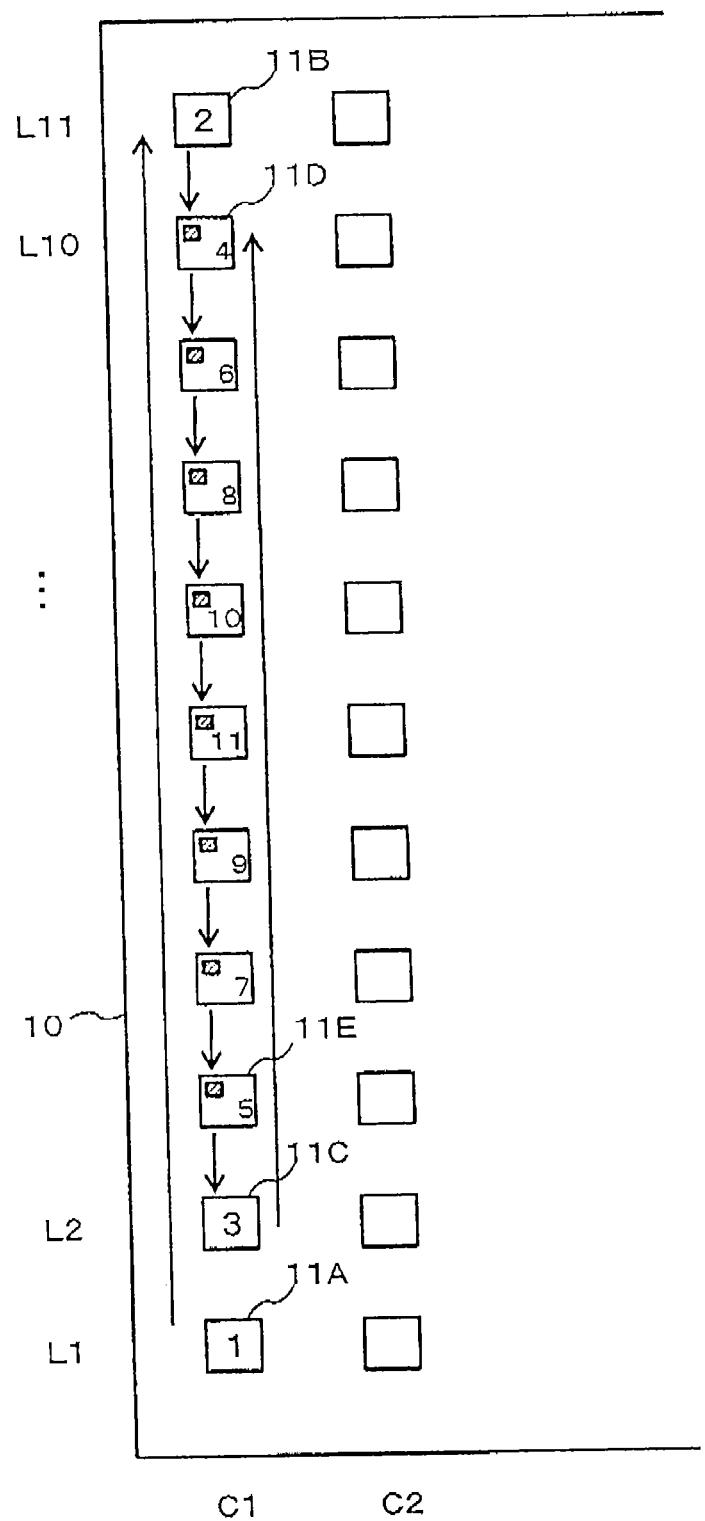
FIG. 6 is an enlarged diagram showing a portion encircled by a broken line shown in FIG. 5.

FIG. 5 is an exemplary diagram used in explaining a first one of the methods of evaluating the charged particle beam drawing apparatus 1 in the embodiments of the present invention. FIG. 6 is an enlarged diagram showing a portion encircled by a broken line shown in FIG. 5.

The measurement patterns 11 in N lines by M columns are formed (drawn) on the main deflection field 10 shown in FIG. 5. The measurement patterns 11 are herein drawn on the one main deflection field 10 at 10 positions in the X direction (a direction of arranging the M columns) by 11 positions in the Y direction (a direction of arranging the N lines), that is, at 110 positions in total. Note that for convenient understanding, the 10 columns countable in the X direction are denoted by C1 to C10 and the 11 lines countable in the Y direction are denoted by L1 to L11.

In addition, numbers described in each measurement pattern 11 represent the order of the drawing. In other words, for example, the measurement pattern 11 representable by coordinates (C1, L1) is drawn firstly in the main deflection field 10. The measurement pattern 11 representable by coordinates (C1, L11) is drawn secondly in the main deflection field 10.

In the first embodiment of the present invention, the measurement patterns 11 are drawn column by column in the main deflection field 10 shown in FIG. 5. For example, the drawing is started in the column C1. After all the measurement patterns 11 included in the column C1 are drawn, the drawing is again started in the adjacent column C2. The drawing is performed in this manner column by column in the X direction from the column C1 to the column C10 in order.

Further, in the column C1, one of the measurement patterns 11 is drawn in a measurement pattern area in the line L1, and then another one of the measurement patterns 11 is drawn in a measurement pattern area in the line L11. Subsequently, one of the measurement patterns 11 is drawn in a measurement pattern area in the line L2, and then another one of the measurement patterns 11 is drawn in a measurement pattern area in the line L10. As described above, it can be said that the order of drawing the measurement patterns 11 in the measurement method shown in FIG. 5 is set such that a distance between two measurement patterns successively drawn in the same column is gradually decreased.

Note that the area in which each measurement pattern 11 is drawn on the evaluation substrate (the mask) M by using the charged particle beam B is hereinafter referred to as the "measurement pattern area" appropriately.

The drawing of the measurement patterns 11 in the order described above is performed in various distances in the moving of the charged particle beam B from the longest distance (moving from the line L1 to the line L11) to the shortest distance (moving from the line L7 to the line L6). This makes it possible to measure displacement of the drawing position in the moving in the various distances.

Next, actual drawing will be described in more detail by using FIG. 6. FIG. 6 shows the columns C1 and C2 in an enlarged manner which are extracted from the main deflection field 10 shown in FIG. 5. As described above, in the evaluation method described in the first embodiment, a measurement pattern 11A is firstly drawn in the measurement pattern area represented by the coordinates (C1, L1), and then a measurement pattern 11B is secondly drawn in the measurement pattern area represented by the coordinates (C1, L11). Thereafter, a measurement pattern 11C is thirdly drawn in the measurement pattern area represented by the coordinates (C1, L2). The charged particle beam B moves in such an order, so that the measurement patterns 11 are drawn in predetermined areas.

At this time, the measurement pattern 11A is drawn firstly, and then the charged particle beam B moves so that the measurement pattern 11B located in the longest distance in the column C1 from the measurement pattern 11A can be drawn secondly. In the moving, the moving in a long distance in the main deflection field 10 means that a high voltage is applied to the corresponding DAC amplifier. For this reason, as described in the section BACKGROUND, a settling condition thereof cannot be declared to be appropriate at this stage, and thus an error could occur.

The "error" herein refers to a position error occurring due to an inaccurate shot of the charged particle beam B at the corresponding measurement pattern 11 which is a target position. In other words, the drawing should be performed in the measurement pattern area (C1, L11) as the measurement pattern 11B, but is performed at a slightly displaced position. The drawing is not performed in the intended measurement pattern area. Since the error here occurs due to the application of the high voltage, it takes a while to solve (cancel out) the error. The error solving time depends on the magnitude of the applied voltage. As described above, the high voltage application leads to a long error solving time. On the other hand, low voltage application leads to a short error solving time, accordingly.

Hence, when the third measurement pattern 11C is drawn in the next measurement pattern area (C1, L2) without any special processing in the state where such an error occurs, a sufficient error solving time cannot be secured because the measurement patterns 11 are successively drawn. This means that the error occurring in drawing the measurement pattern 11B is not canceled out, that is, the error remains. For this reason, the successive drawing leads to the drawing of the third measurement pattern 11C in the error state. Moreover, a moving distance from the measurement pattern area (C1, L11) for the second measurement pattern 11B to the measurement pattern area (C1, L2) for the third measurement pattern 11C is the second longest distance after a moving distance from the measurement pattern area (C1, L1) for the first measurement pattern 11A to the measurement pattern area (C1, L11) for the second measurement pattern 11B.

An error also occurs when the charged particle beam B moves from the second measurement pattern 11B to the third measurement pattern 11C. Before the error occurring in the moving from the first measurement pattern 11A to the second measurement pattern 11B is solved, the charged particle beam B moves from the second measurement pattern 11B to the third measurement pattern 11C. Since an error also occurs in the moving, errors are consequently accumulated. This not only results in a failure in accurate drawing but also makes impossible to calculate an accurate settling condition.

Hence, the embodiment of the present invention employs the method shown below.

Specifically, in the method, the charged particle beam B does not move directly from the second measurement pattern 11B to the third measurement pattern 11C. Instead, the charged particle beam B moves in order from one of the measurement patterns 11 at a moving start position to one of the measurement patterns 11 to be drawn at an adjacent position in such a manner as to move to a measurement pattern area to be fourthly drawn shown by (C1, L10), a measurement pattern area to be sixthly drawn shown by (C1, L9), and an measurement pattern area to be eighthly drawn shown by (C1, L8) in this order. Then, the charged particle beam B lastly reaches one of the measurement patterns 11 which is the moving destination. FIG. 6 shows that the charged particle beam B moves in this manner, by using solid line arrows.

As described above, repeating the moving in the short distance after the moving in the long distance makes it possible to secure time for solving an error involved with the moving in the long distance. An error involved with the moving in the distance between adjacent measurement pattern areas originally has a low voltage due to its short distance. Even though the error occurs, the time for solving the error is very short and ignorable. Accordingly, it is believed that reduction or solving can be fully performed on an error occurring in the moving from the measurement pattern 11A to the measurement pattern 11B while the charged particle beam B is moving from the moving start measurement pattern 11B to the moving destination measurement pattern 11C through the adjacent measurement pattern areas. When the charged particle beam B reaches the measurement pattern area to be drawn as the moving destination to perform the drawing on the measurement pattern 11C, the error having occurred has been fully reduced or solved. Thus, the drawing can be performed without the remaining error.

Note that an error also occurs when the charged particle beam B moves from the measurement pattern area (C1, L2) to the measurement pattern area (C1, L10) for drawing a measurement pattern 11D after drawing the measurement pattern 11C. However, as described above, the charged particle beam E moves from the measurement pattern 11D and reaches a measurement pattern 11E to be drawn next through the adjacent measurement pattern areas. At this time, an error involved with the moving from the measurement pattern 11C to the measurement pattern 11D is fully reduced or solved.

In addition, in the moving in the short distance, the drawing is actually performed by using the charged particle beam B. However, the charged particle beam B does not take a shot large enough for exposure which is as large as shots taken at the areas for the measurement patterns 11A and 11B. If such a large shot is taken before using the corresponding measurement pattern area to be drawn later in the moving of the charged particle beam B, the measurement pattern area could not be used. This results in just moving of the charged particle beam B in a short distance from a moving start measurement pattern to an adjacent measurement pattern and cannot achieve the original object of the invention which is to calculate a settling condition by utilizing drawing performed by moving the charged particle beam B in various distances.

Hence, in this embodiment of the present invention, tiny shots are taken at mutually adjacent measurement pattern areas located in the course of the moving to the originally intended moving destination. Each "tiny" shot is a shot smaller than a beam resolution. For example, when the size of a measurement pattern is represented by 1, the "tiny" shot is about a thousandth part thereof. Alternatively, a dimension equivalent to the minimum data resolution may be used. Such a size prevents exposure even though an exposure process is performed in a processing process after the drawing process, and does not hinder the calculation of the settling condition.

Thus, such a tiny shot does not occupy an entire area usable for evaluation in a measurement pattern area where the drawing is yet to be performed. Moreover, even if the originally intended drawing is performed separately, is possible to check whether or not an error occurs at a shot position in the drawing, and thus to fully perform evaluation required for calculating the settling condition.

Starting at the measurement pattern 11D to be drawn fourthly which is shown in FIG. 6, the tiny shot is shown by each small hatched square in the mutually adjacent measurement patterns in the column C1 ranging from the second measurement pattern 11B at the moving start position to the third measurement pattern 11C at the moving destination.

As described above, the method is employed in which the charged particle beam B moves to the measurement pattern area which is the drawing target while taking the tiny shots. Thereby, even though the tiny shots are taken, it is possible to move the charged particle beam B without leaving traces thereof, and to achieve the object of the invention which is to measure the position errors in various distances in the moving of the charged particle beam B.

The charged particle beam B moves from the measurement pattern 11B drawn secondly to the measurement pattern 11C to be drawn thirdly, so that the drawing is performed on the measurement pattern 11C. Subsequently, the charged particle beam B directly moves to the measurement pattern area to be drawn fourthly located at (C1, L10). Then, the measurement pattern 11D is drawn, and thereafter the charged particle beam B heads for the measurement pattern 11E to be drawn next, while moving through the adjacent measurement pattern areas one by one.

After the measurement patterns 11 are drawn in the main deflection field 10 in the order described above, the evaluation substrate M is taken out of the charged particle beam drawing apparatus 1 (ST3 in FIG. 4). This is performed for the processing process such as exposure. The processing process can make clear traces of the shots of the charged particle beam B used for the drawing on the measurement patterns 11. Note that as described above, the traces of the tiny shots are not left even after the processing process.

Thereafter, position errors in the main deflection field 10 of the evaluation substrate M are extracted as measurement data by using a position error measurement device (ST4). The measurement data is base data for calculating the settling condition. Note that the description has herein been given of the example of extracting the measurement data by using the position error measurement device which is a separate device from the charged particle beam drawing apparatus 1, but when the charged particle beam drawing apparatus 1 has the function of the position error measurement device, the charged particle beam drawing apparatus 1 extracts the measurement data.

The extracted measurement data is inputted into the charged particle beam drawing apparatus 1 again and is subjected to an analysis, and position errors thereof are checked (ST5). In other words, the inputted measurement data is analyzed by the analyzer 37 in the control computation device 31.

The measurement data analyzed by the analyzer 37 is transmitted to the calculator 38, and an optimum settling condition in the main deflection field 10 is calculated (ST6). As has been described above, the employment of the drawing order in the first embodiment leads to various long and short distances in the moving of the charged particle beam B, and accordingly makes it possible to evaluate various patterns drawn with the distances varied.

According to the method described above, position errors due to the moving of the charged particle beam in the long distance are prevented as much as possible, so that the drawing on the measurement patterns is performed more accurately. Thereby, it is possible to provide a charged particle beam drawing method and a charged particle beam 2S drawing apparatus which are capable of calculating a settling condition with high accuracy.

In particular, after moving in the long distance, the charged particle beam moves to the next shot-target measurement pattern area while taking the tiny shots at the adjacent measurement pattern areas. Thereby, an error occurring due to the moving of the charged particle beam in the long distance can be cancelled out. In addition, errors caused by the tiny shots taken in the moving are ignorable. Accordingly, when the charged particle beam moves to the next drawing-target measurement pattern area, it is possible to reduce or cancel out the error due to the shot of the charged particle beam taken at a measurement pattern on which the drawing is performed immediately before the moving. Thus, only errors purely attributable to the moving distance of the charged particle beam can be extracted from the evaluation substrate.

Moreover, it is possible to extract not only the measurement data of the shortest or the longest moving distance but also measurement data of the various distances including the shortest and the longest moving distances. Thus, the measurement data can be extracted from the one evaluation substrate, and evaluation can be performed in a state where other error factors are eliminated to some extent.

Further, since multiple pieces of measurement data of the same moving distance can be extracted, the settling condition can be calculated with higher accuracy.

Second Embodiment

Next, a second embodiment of the present invention will be described. Note that in the second embodiment, the same components as the components described in the foregoing first embodiment are denoted by the same respective reference numerals, and overlapping descriptions of these same components are omitted.

An evaluation method in the second embodiment is the same as that in the first embodiment in an apparatus configuration and the like, but is different in the order of drawing the measurement patterns to be drawn in the main deflection field.

Figure 7:
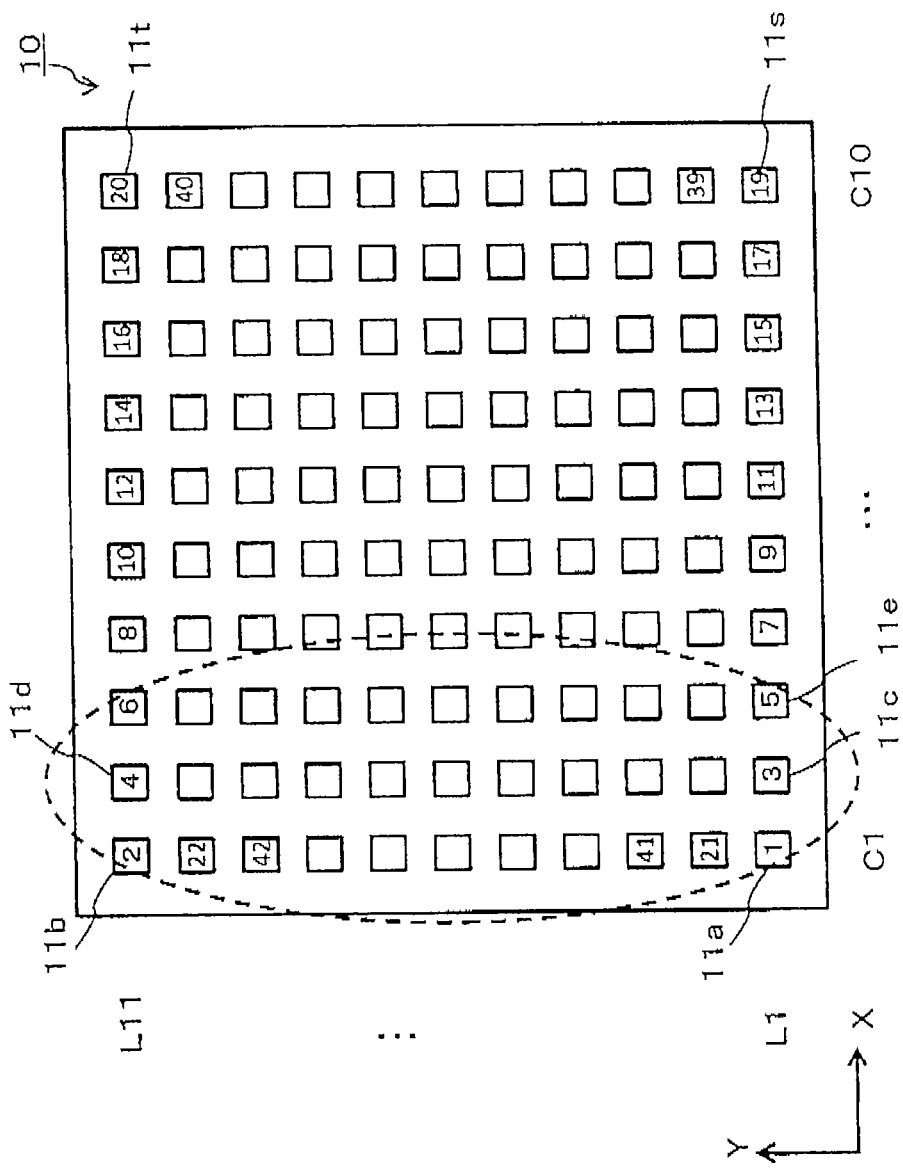
FIG. 7 an exemplary diagram used in explaining a second evaluation method in a second embodiment of the present invention out of the methods of evaluating the charged particle beam drawing apparatus.
Figure 8:
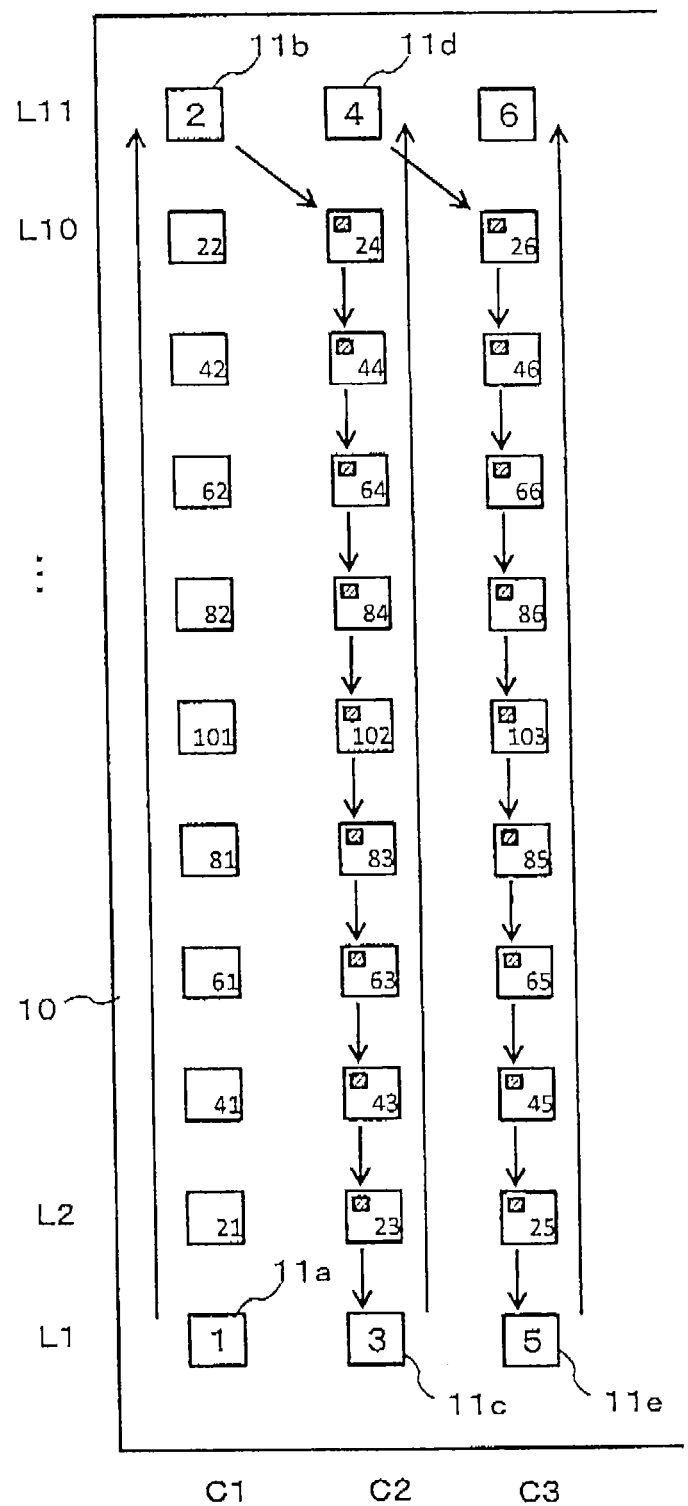
FIG. 8 is an enlarged diagram showing a portion encircled by a broken line shown in FIG. 7.
Figure 9:
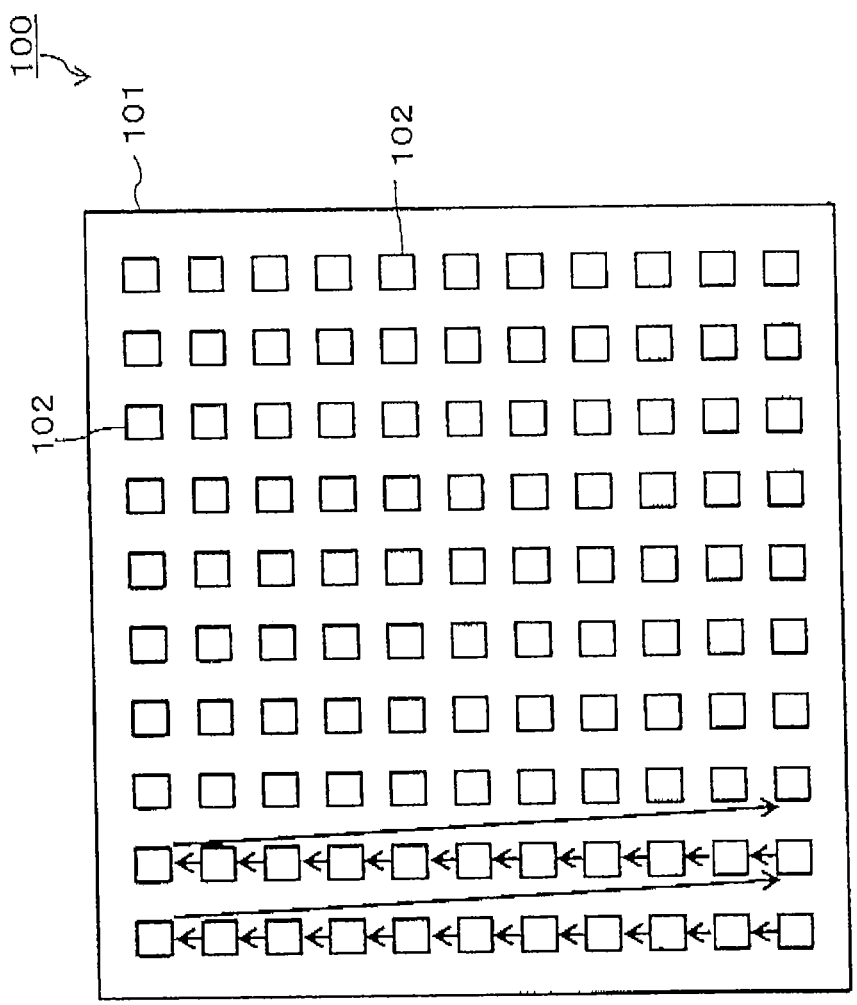
FIG. 9 is an exemplary diagram for explaining the order of drawing measurement patterns in a main deflection filed in a conventional technique.
Figure 10:
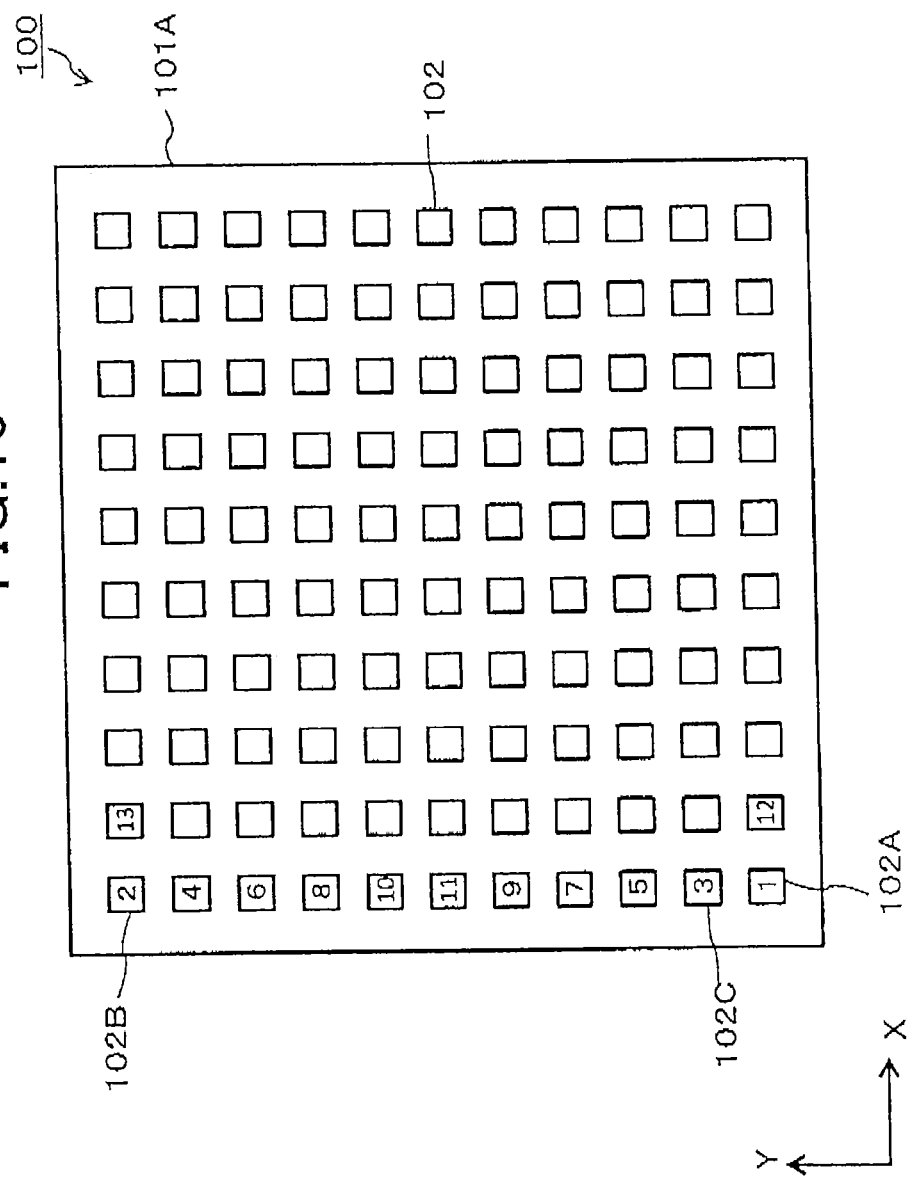
FIG. 10 is an exemplary diagram for explaining the order of drawing measurement patterns in a main deflection filed in a conventional technique.

FIG. 7 is an exemplary diagram used in explaining a second one of the methods of evaluating the charged particle beam drawing apparatus 1 in the embodiments of the present invention. FIG. 8 is an enlarged diagram showing a portion encircled by a broken line shown in FIG. 7.

In the evaluation method to be described in the second embodiment, the order of the drawing first and second measurement patterns is the same as the order in the aforementioned first evaluation method. Specifically, a measurement pattern 11a in the measurement pattern area (C1, L1) is drawn firstly, and then a measurement pattern 11b in the measurement pattern area (C1, L11) is drawn secondly. However, the order of the subsequent drawing of the other measurement patterns in the main deflection field 10 is different from that in the aforementioned evaluation method in the first embodiment.

A measurement pattern 11c to be drawn thirdly after the measurement pattern 11b secondly drawn in the measurement pattern area (C1, L11) is located in the measurement pattern area (C2, L1). That is, the measurement pattern 11c is adjacent on the right to the measurement pattern 11a drawn firstly (in FIG. 7). A measurement pattern 11d to be drawn fourthly is located in the measurement pattern area (C2, L11) adjacent on the right to the measurement pattern 11b drawn secondly (in FIG. 7).

In the second evaluation method as described above, the drawing is performed alternately in the first line (the line L1, for example) constituted of measurement patterns to be drawn and the second line (the line L11, for example) constituted of measurement patterns to be drawn in the longest distance from the first line, as shown in FIG. 7.

Then, in the first and second lines (the lines L1 and L2), a new measurement pattern (for example, the measurement pattern 11c in the Line L1 or the measurement pattern 11d in the L11) is in order drawn at a position adjacent in the X direction to the measurement pattern (for example, the measurement pattern 11a in the line L1 or the measurement pattern 11b in the line L11) drawn in the corresponding line immediately before the new measurement pattern is drawn.

To put it differently, the measurement patterns 11 belonging to the two lines located farthest away from each other are drawn alternately, while the measurement patterns 11 belonging to the same line are drawn in order. With reference to the main deflection field 10 shown in FIG. 7, the drawing is performed in such a manner that the measurement patterns 11 in the lines L1 and L11 are drawn alternately without drawing the measurement patterns 11 not included in the lines L1 and L11. Thus, in FIG. 7, the numbers indicating the drawing order are assigned alternately to the measurement pattern 11a (C1, L1), the measurement pattern 11b (C1, L11), the measurement pattern 11c (C2, L1), and the measurement pattern 11d (C2, L11).

This is continued until there is no measurement pattern 11 in the line L1 or L11 in the X direction (up to a measurement pattern 11s to be drawn 19th (L1, C10) and a measurement pattern 11t to be drawn 20th (L11, C10) in FIG. 7). Thereafter, the measurement patterns 11 in two lines farthest away from each other in this state (herein, the measurement patterns 11 in the lines L2 and L10) are drawn.

The drawing of the measurement patterns 11 in the aforementioned order means that the drawing is performed in the various distances of the moving of the charged particle beam B from the longest distance (from the line L1 to the line L11) to the shortest distance (from the line L7 to the line L6), thus making it possible to measure displacements of the drawing positions in the moving in the various distances.

Next, actual drawing will be described in more detail by using FIG. 8. FIG. 8 shows the enlarged columns C1 to C3 extracted from the main deflection field 10 in FIG. 7. As described above, in the evaluation method herein described, after the measurement pattern 11a is firstly drawn in the measurement pattern area shown by the coordinates (C1, L1), the measurement pattern 11b is secondly drawn in the measurement pattern area shown by the coordinates (C1, L11). Subsequently, the measurement pattern 11c is drawn thirdly in the measurement pattern area shown by the coordinates (C2, L1). The charged particle beam B moves in the order as described above, so that the measurement patterns 11 are drawn in the predetermined areas.

In the drawing, after the measurement pattern 11a is drawn firstly, the charged particle beam B moves so that the measurement pattern 11b in the longest distance in the column C1 can be drawn secondly. This moving is long distance moving and means that a high voltage is applied. For this reason, as described in the section BACKGROUND, a settling condition thereof cannot be declared to be appropriate at this stage, and thus an error could occur.

As described above, the "error" herein refers to a position error occurring due to an inaccurate shot of the charged particle beam B at the corresponding measurement pattern 11 which is a target position. Since the error here occurs due to the application of the high voltage, it takes a while to solve (cancel out) the error. The error solving time depends on the magnitude of the applied voltage. As described above, the high voltage application leads to a long error solving time. On the other hand, low voltage application leads to a short error solving time, accordingly.

Hence, when the third measurement pattern 11c is drawn in the next measurement pattern area (C2, L1) without any special processing in the state where such an error occurs, a sufficient error solving time cannot be secured because the measurement patterns 11 are successively drawn. This leads to a failure to cancel out an error, so that the error occurring in drawing the measurement pattern 11b remains. For this reason, the successive drawing leads to the drawing of the third measurement pattern 11c in the error state. Moreover, a moving distance from the measurement pattern area (C1, L11) for the second measurement pattern 11b to the measurement pattern area (C2, L1) for the third measurement pattern 11c is a long distance equivalent to a moving distance from the measurement pattern area (C1, L1) for the first measurement pattern 11a to the measurement pattern area (C1, L11) for the second measurement pattern 11b.

An error also occurs when the charged particle beam moves from the second measurement pattern 11b to the third measurement pattern 11c. Before the error occurring in the moving from the first measurement pattern 11a to the second measurement pattern 11b is reduced or cancelled out, the charged particle beam B moves from the second measurement pattern 11b to the third measurement pattern 11c. Since an error also occurs in the moving, errors are consequently accumulated. This not only results in a failure in accurate drawing but also makes impossible to calculate an accurate settling condition.

Hence, the second embodiment of the present invention employs the method shown below.

Specifically, in the method, the charged particle beam B does not move directly from the second measurement pattern 11b to the third measurement pattern 11c. Instead, the charged particle beam B moves to a drawing area for a third measurement pattern area (herein, the measurement pattern 11c) while taking tiny shots at measurement pattern areas in the second column (the column C2) adjacent to the first column (the column C1) including first and second measurement patterns (herein, the measurement patterns 11a and 11b). In order to achieve this, the charged particle beam B moves in order from a measurement pattern area at a moving start position to a measurement pattern area to be drawn at a position adjacent thereto in such a manner as to move to a measurement pattern area to be drawn 24th shown by (C2, L10), a measurement pattern area to be drawn 44th shown by (C2, L9), and a measurement pattern area to be drawn 64th shown by (C2, L8) in this order. Then, the charged particle beam B lastly reaches a measurement pattern area which is the moving destination. FIG. 8 shows that the charged particle beam B moves in this manner, by using solid line arrows.

Note that the moving method is provided for only an exemplary purpose. For example, the following method may be employed. Specifically, the charged particle beam B moves from a measurement pattern area (herein the measurement pattern 11b) at a moving start position to a measurement pattern area to be drawn 22nd shown by (C1, L10). Subsequently, the charged particle beam B moves to a measurement pattern area to be drawn 42nd shown by (C1, L9), and reaches a measurement pattern area to be drawn 21st shown by (C1, L2) through measurement pattern areas in the column C1. Thereafter, the charged particle beam B lastly moves to a measurement pattern area for the measurement pattern 11c to be drawn thirdly which is the moving destination.

As described above, repeating the moving in the short distance after the moving in the long distance makes it possible to secure time for solving an error involved with the moving in the long distance. An error involved with moving in the distance between adjacent measurement pattern areas originally has a low voltage due to its short distance. Also for this reason, even though the error occurs, the time for solving the error is very short and ignorable. Accordingly, it is believed that reduction or solving can be fully performed on an error occurring in the moving from the measurement pattern 11a to the measurement pattern 11b while the charged particle beam B is moving from the moving start measurement pattern 11b to the moving destination measurement pattern 11c through the adjacent measurement pattern areas. When the charged particle beam B reaches the measurement pattern area to be drawn as the moving destination to perform the drawing on the measurement pattern 11c, the error having occurred has been fully reduced or cancelled out. Thus, the drawing can be performed without the remaining error.

Note that an error also occurs when the charged particle beam B moves from the measurement pattern area (C2, L1) to the measurement pattern area (C2, L11) for drawing a measurement pattern 11d after drawing the measurement pattern 11c. However, as described above, the charged particle beam B moves from the measurement pattern 11d and reaches a measurement pattern 11e to be drawn next through the adjacent measurement pattern areas. At this time, an error involved with the moving from the measurement pattern 11c to the measurement pattern 11d is solved.

In addition, in the moving in the short distance, the drawing is actually performed by using the charged particle beam B. However, the charged particle beam B does not take a shot large enough for exposure which is as large as shots taken at the areas for the measurement patterns 11a and 11b. If such a large shot is taken before using the corresponding measurement pattern area to be drawn later in the moving of the charged particle beam B, the measurement pattern area could not be used. This results in just moving of the charged particle beam B in a short distance from a moving start measurement pattern to an adjacent measurement pattern and cannot achieve the original object of the invention which is to calculate a settling condition by utilizing drawing performed by moving the charged particle beam E in various distances.

Hence, in this embodiment of the present invention, tiny shots are taken at mutually adjacent measurement pattern areas located in the course of the moving to the originally intended moving destination. Each "tiny" shot is a shot smaller than a beam resolution. For example, when the size of a measurement pattern is represented by 1, the "tiny" shot is about a thousandth part thereof. Alternatively, the dimension equivalent to the minimum data resolution is preferably used. Such a size prevents exposure even though the exposure process is performed in the processing process after the drawing process, and does not hinder the calculation of the settling condition.

Thus, such a tiny shot does not occupy an entire area usable for evaluation in a measurement pattern area where the drawing is yet to be performed. Moreover, even if the originally intended drawing is performed separately, it is possible to check whether or not an error occurs at a shot position in the drawing, and thus to fully perform evaluation required for calculating the settling condition.

Starting at the measurement pattern 11d to be drawn 24th which is shown in FIG. 8, the tiny shot is shown by each small hatched square in the mutually adjacent measurement patterns in the column C2 ranging from the second measurement pattern 11b at the moving start position to the third measurement pattern 11c at the moving destination.

As described above, the method is employed in which the charged particle beam B moves to the measurement pattern area which is the drawing target while taking the tiny shots. Thereby, it is possible to move the charged particle beam B without leaving traces thereof, and to achieve the object of the invention which is to measure the position errors in various distances in the moving of the charged particle beam B.

The charged particle beam B moves from the measurement pattern 11b drawn secondly to the measurement pattern 11c to be drawn thirdly, so that the drawing is performed on the measurement pattern 11c. Subsequently, the charged particle beam B directly moves to the measurement pattern area to be drawn fourthly located at (C2, L11). Then, the measurement pattern 11d is drawn, and thereafter the charged particle beam B heads for the measurement pattern 11e to be drawn next, while moving through the adjacent measurement pattern areas one by one.

After the measurement patterns 11 are drawn in the main deflection field 10 in the order described above, the evaluation substrate M is taken out of the charged particle beam drawing apparatus 1 (ST3 in FIG. 4). This is performed for the processing process such as exposure. The processing process can make clear traces of the shots of the charged particle beam B used for the drawing on the measurement patterns 11. Note that as described above, the traces of the tiny shots are not left even after the processing process.

Thereafter, position errors in the main deflection field 10 of the evaluation substrate M are extracted as measurement data by using a position error measurement device (ST4). The measurement data is base data for calculating the settling condition. The extracted measurement data is inputted into the charged particle beam drawing apparatus 1 again and is subjected to an analysis, and position errors thereof are checked (ST5). In other words, the inputted measurement data is analyzed by the analyzer 37 in the control computation device 31.

The measurement data analyzed by the analyzer 37 is transmitted to the calculator 38, and an optimum settling condition in the main deflection field 10 is calculated (ST6). As has been described above, the employment of the drawing order in the second embodiment leads to various long and short distances in the moving of the charged particle beam B, and accordingly makes it possible to evaluate various patterns drawn with the distances varied.

According to the method described above, position errors due to the moving of the charged particle beam in the long distance are prevented as much as possible, so that the drawing on the measurement patterns is performed more accurately. Thereby, it is possible to provide a charged particle beam drawing method and a charged particle beam drawing apparatus which are capable of calculating a settling condition with high accuracy.

In particular, after moving in the long distance, the charged particle beam moves to the next shot-target measurement pattern area while taking the tiny shots at the adjacent measurement pattern areas. Thereby, an error occurring due to the moving of the charged particle beam in the long distance can be cancelled out. In addition, errors caused by the tiny shots taken in the moving are ignorable. Accordingly, when the charged particle beam moves to the next drawing-target measurement pattern area, it is possible to reduce or cancel out the error due to the shot of the charged particle beam taken at a measurement pattern on which the drawing is performed immediately before the moving. Thus, only errors purely attributable to the moving distance of the charged particle beam can be extracted from the evaluation substrate.

Moreover, it is possible to extract not only the measurement data of the shortest or the longest moving distance but also measurement data of the various distances including the shortest and the longest moving distances. Thus, the measurement data can be extracted from the one evaluation substrate, and evaluation can be performed in a state where other error factors are eliminated to some extent.

Further, since multiple pieces of measurement data of the same moving distance can be extracted, the settling condition can be calculated with higher accuracy.

While certain embodiments have been described, these embodiments have been presented by way of example only, and are not intended to limit the scope of the inventions.

For example, if an error occurring while the charged particle beam moves in a long distance is considered not to be fully reduced or cancelled out before the drawing of the next measurement pattern is started, the number of the tiny shots taken in the course of the moving of the charged particle beam can even be increased by an integral multiple thereof. In this case, each tiny shot is preferably taken in a size of about a thousandth part of a measurement pattern which is represented by 1, for example. Alternatively, the dimension equivalent to the minimum data resolution is preferably used.

Indeed, the novel embodiments described herein may be embodied in a variety of other forms; furthermore, various omissions, substitutions and changes in the form of the embodiments described herein may be made without departing from the spirit of the inventions.

For example, in each of the embodiments described above, the description has been given by taking the example in which the measurement patterns are drawn based on the columns, but the measurement patterns may be drawn based on the lines.

The accompanying claims and their equivalents are intended to cover such forms or modifications as would fall within the scope and spirit of the inventions.

What is claimed is:

1. A charged particle beam drawing method for drawing measurement patterns on a mask based on control data outputted from a storage unit, the mask having a plurality of stripes set therein, the stripes each having a plurality of main deflection fields in each of which N×M measurement patterns are to be formed respectively in a plurality of measurement pattern areas, the charged particle beam drawing method comprising the steps of:

forming a first measurement pattern in a first measurement pattern area;

in succession with processing of forming the first measurement pattern, forming a second measurement pattern in a second measurement pattern area located farthest from the first measurement pattern area in the same column as the first measurement pattern area; and in moving a charged particle beam from the second measurement pattern area to a third measurement pattern area located adjacent to the first measurement pattern area in the same column as the first and second measurement patterns to form a third measurement pattern, moving the charged particle beam to the third measurement pattern area while taking tiny shots approximately equivalent to a data resolution at the adjacent measurement pattern areas to be drawn in the same column one after another from the second measurement pattern.

2. The charged particle beam drawing method according to claim 1, further comprising the steps of:

forming the third measurement pattern after moving to the third measurement pattern area; and thereafter forming all the N measurement patterns in the same column as the first to the third measurement patterns in such a manner as to alternately repeat the step of forming the measurement patterns in succession and the step of forming the next measurement pattern after moving the charged particle beam to the next measurement pattern area to be drawn while taking tiny shots approximately equivalent to the data resolution at adjacent measurement pattern areas to be drawn in the same column.

3. The charged particle beam drawing method according to claim 2, wherein all the measurement patterns to be formed on the mask are formed in such a manner as to alternately repeat, after forming all the N measurement patterns in one column, the step of forming measurement patterns in succession in N measurement patterns in a next (M+1)th column and the step of forming a next measurement pattern after moving the charged particle beam to the next measurement pattern area to be drawn while taking tiny shots approximately equivalent to the data resolution at adjacent measurement pattern areas to be drawn in the next (M+1)th column.

4. A charged particle beam drawing method for drawing measurement patterns on a mask based on control data outputted from a storage unit, the mask having a plurality of stripes set therein, the stripes each having a plurality of main deflection fields in each of which N×M measurement patterns are to be formed respectively in a plurality of measurement pattern areas, the charged particle beam drawing method comprising the steps of:

forming a first measurement pattern in a first measurement pattern area;

in succession with processing of forming the first measurement pattern, forming a second measurement pattern in a second measurement pattern area located farthest from the first measurement pattern area in the same line as the first measurement pattern area; and in moving a charged particle beam from the second measurement pattern area to a third measurement pattern area located adjacent to the first measurement pattern area in the same line as the first and second measurement patterns to form a third measurement pattern, moving the charged particle beam to the third measurement pattern area while taking tiny shots approximately equivalent to a data resolution at the adjacent measurement pattern areas to be drawn in the same line one after another from the second measurement pattern.

5. The charged particle beam drawing method according to claim 4, further comprising the steps of:

forming the third measurement pattern after moving to the third measurement pattern area; and thereafter forming all the M measurement patterns in the same line as the first to the third measurement patterns in such a manner as to alternately repeat the step of forming the measurement patterns in succession and the step of forming the next measurement pattern after moving the charged particle beam to the next measurement pattern area to be drawn while taking tiny shots approximately equivalent to the data resolution at adjacent measurement pattern areas to be drawn in the same line.

6. The charged particle beam drawing method according to claim 5, wherein all the measurement patterns to be formed on the mask are formed in such a manner as to alternately repeat, after forming all the M measurement patterns in one line, the step of forming measurement patterns in succession in M measurement patterns in a next (N+1)th line and the step of forming a next measurement pattern after moving the charged particle beam to the next measurement pattern area to be drawn while taking tiny shots approximately equivalent to the data resolution at adjacent measurement pattern areas to be drawn in the next (N+1)th line.

7. A charged particle beam drawing method for drawing measurement patterns on a mask based on control data outputted from a storage unit, the mask having a plurality of stripes set therein, the stripes each having a plurality of main deflection fields in each of which N×M measurement patterns are to be formed respectively in a plurality of measurement pattern areas, the charged particle beam drawing method comprising the steps of:

forming a first measurement pattern in a first measurement pattern area;

in succession with processing of forming the first measurement pattern, forming a second measurement pattern in a second measurement pattern area located farthest from the first measurement pattern area in the same column as the first measurement pattern; and in moving a charged particle beam from the second measurement pattern area to a third measurement pattern area located in a column adjacent to the first and second measurement patterns, and located adjacent to the first measurement pattern area in the same line as the first measurement pattern, moving the charged particle beam from the second measurement pattern to a certain one of the measurement pattern areas to be drawn located in the adjacent column and moving the charged particle beam to the third measurement pattern area while taking tiny shots approximately equivalent to a data resolution at the adjacent measurement pattern areas in the same column one after another from the certain measurement pattern area.

8. The charged particle beam drawing method according to claim 7, further comprising the steps of:

forming the third measurement pattern after moving to the third measurement pattern area; and thereafter forming all the M measurement patterns in the same line as the first measurement pattern and all the M measurement patterns in the same line as the second measurement pattern in such a manner as to alternately repeat the step of forming the measurement patterns in succession and the step of forming the next measurement pattern by moving the charged particle beam to the next measurement pattern area to be drawn while taking tiny shots approximately equivalent to the data resolution at measurement pattern areas to be drawn in the column adjacent to the formed measurement patterns.

9. The charged particle beam drawing method according to claim 8, wherein after all the M measurement patterns in both the two lines are formed, M measurement patterns in a line adjacent to each of the two lines of the formed measurement patterns are formed in such a manner as to alternately repeat the step of forming the measurement patterns in succession and the step of forming a next measurement pattern after moving the charged particle beam to the next measurement pattern area to be drawn while taking tiny shots approximately equivalent to the data resolution at adjacent measurement pattern areas to be drawn in the column adjacent to the formed measurement patterns.

10. A charged particle beam drawing method for drawing measurement patterns on a mask based on control data outputted from a storage unit, the mask having a plurality of stripes set therein, the stripes each having a plurality of main deflection fields in each of which N×M measurement patterns are to be formed respectively in a plurality of measurement pattern areas, the charged particle beam drawing method comprising the steps of:

forming a first measurement pattern in a first measurement pattern area;

in succession with processing of forming the first measurement pattern, forming a second measurement pattern in a second measurement pattern area located farthest from the first measurement pattern area in the same line as the first measurement pattern; and in moving a charged particle beam from the second measurement pattern area to a third measurement pattern area located in a line adjacent to the first and second measurement patterns, and located adjacent to the first measurement pattern area in the same column as the first measurement pattern, moving the charged particle beam from the second measurement pattern to a certain one of the measurement pattern areas to be drawn located in the adjacent line and moving the charged particle beam to the third measurement pattern area while taking tiny shots approximately equivalent to a data resolution at the adjacent measurement pattern areas in the same line one after another from the certain measurement pattern area.

11. The charged particle beam drawing method according to claim 10, further comprising the steps of:

forming the third measurement pattern after moving to the third measurement pattern area; and thereafter forming all the M measurement patterns in the same column as the first measurement pattern and all the M measurement patterns in the same column as the second measurement pattern in such a manner as to alternately repeat the step of forming the measurement patterns in succession and the step of forming the next measurement pattern by moving the charged particle beam to the next measurement pattern area to be drawn while taking tiny shots approximately equivalent to the data resolution at measurement pattern areas to be drawn in the line adjacent to the formed measurement patterns.

12. The charged particle beam drawing method according to claim 11, wherein after all the M measurement patterns in both the two columns are formed, M measurement patterns in a column adjacent to each of the two columns of the formed measurement patterns are formed in such a manner as to alternately repeat the step of forming the measurement patterns in succession and the step of forming a next measurement pattern after moving the charged particle beam to the next measurement pattern area to be drawn while taking tiny shots approximately equivalent to the data resolution at adjacent measurement pattern areas to be drawn in the line adjacent to the formed measurement patterns.

13. A charged particle beam drawing method for drawing measurement patterns on a mask based on control data outputted from a storage unit, the mask having a plurality of stripes set therein, the stripes each having a plurality of main deflection fields in each of which N×M measurement patterns are to be formed respectively in a plurality of measurement pattern areas, the charged particle beam drawing method comprising the steps of:

forming a first measurement pattern in a first measurement pattern area;

in succession with processing of forming the first measurement pattern, forming a second measurement pattern in a second measurement pattern area located farthest from the first measurement pattern area in the same column as the first measurement pattern area; and in moving a charged particle beam from the second measurement pattern area to a third measurement pattern area located in a column adjacent to the first and second measurement patterns and located adjacent to the first measurement pattern area in the same line as the first measurement pattern, moving the charged particle beam while taking tiny shots approximately equivalent to a data resolution at the adjacent measurement pattern areas in the same column as the first and the second measurement pattern areas one after another from the second measurement pattern area, and then, after taking a tiny shot at the measurement pattern area adjacent to the first measurement pattern in the same column as the first measurement pattern, shifting the charged particle beam by one column to the third measurement pattern in the next column from the measurement pattern area adjacent to the first measurement pattern.

14. The charged particle beam drawing method according to claim 13, further comprising the steps of:

forming the third measurement pattern after moving to the third measurement pattern area; and thereafter forming all the M measurement patterns in the same line as the first measurement pattern and all the M measurement patterns in the same line as the second measurement pattern in such a manner as to alternately repeat the step of forming the measurement patterns in succession and the step of moving the charged particle beam while taking tiny shots approximately equivalent to the data resolution at the adjacent measurement pattern areas to be drawn in the same column, then after taking a tiny shot at the measurement pattern area adjacent to the first measurement pattern area in the same column as the first measurement pattern area, moving the charged particle beam to a next measurement pattern area to be drawn located in the column adjacent to the measurement pattern area adjacent to the first measurement pattern area, and then forming a next measurement pattern area in the adjacent column.

15. The charged particle beam drawing method according to claim 14, wherein after all the M measurement patterns in both the two lines are formed, M measurement patterns in a line adjacent to each of the two lines of the formed measurement patterns are formed in such a manner as to alternately repeat the step of forming the measurement patterns in succession and the step of moving the charged particle beam while taking tiny shots approximately equivalent to the data resolution at the adjacent measurement pattern areas to be drawn in the same column as the formed measurement patterns, then after taking a tiny shot at the measurement pattern area adjacent to the formed measurement pattern opposite to the lastly-formed measurement pattern in the same column, moving the charged particle beam to a next measurement pattern area to be drawn located in a column adjacent to the measurement pattern area adjacent to the formed measurement pattern, and then forming a next measurement pattern area in the adjacent column.

16. A charged particle beam drawing method for drawing measurement patterns on a mask based on control data outputted from a storage unit, the mask having a plurality of stripes set therein, the stripes each having a plurality of main deflection fields in each of which N×M measurement patterns are to be formed respectively in a plurality of measurement pattern areas, the charged particle beam drawing method comprising the steps of:

forming a first measurement pattern in a first measurement pattern area;

in succession with processing of forming the first measurement pattern, forming a second measurement pattern in a second measurement pattern area located farthest from the first measurement pattern area in the same line as the first measurement pattern area; and in moving a charged particle beam from the second measurement pattern area to a third measurement pattern area located in a line adjacent to the first and second measurement patterns and located adjacent to the first measurement pattern area in the same column as the first measurement pattern, moving the charged particle beam while taking tiny shots approximately equivalent to a data resolution at the adjacent measurement pattern areas in the same line as the first and the second measurement pattern areas one after another from the second measurement pattern area, and then, after taking a tiny shot at the measurement pattern area adjacent to the first measurement pattern in the same line as the first measurement pattern, shifting the charged particle beam by one line to the third measurement pattern in the next line from the measurement pattern area adjacent to the first measurement pattern.

17. The charged particle beam drawing method according to claim 16, further comprising the steps of:

forming the third measurement pattern after moving to the third measurement pattern area; and thereafter forming all the M measurement patterns in the same column as the first measurement pattern and all the M measurement patterns in the same column as the second measurement pattern in such a manner as to alternately repeat the step of forming the measurement patterns in succession and the step of moving the charged particle beam while taking tiny shots approximately equivalent to the data resolution at the adjacent measurement pattern areas to be drawn in the same line, then after taking a tiny shot at the measurement pattern area adjacent to the first measurement pattern area in the same line as the first measurement pattern area, moving the charged particle beam to a next measurement pattern area to be drawn located in the line adjacent to the measurement pattern area adjacent to the first measurement pattern area, and then forming a next measurement pattern area in the adjacent line.

18. The charged particle beam drawing method according to claim 17, wherein after all the M measurement patterns in both the two columns are formed, M measurement patterns in a column adjacent to each of the two columns of the formed measurement patterns are formed in such a manner as to alternately repeat the step of forming the measurement patterns in succession and the step of moving the charged particle beam while taking tiny shots approximately equivalent to the data resolution at the adjacent measurement pattern areas to be drawn in the same line as the formed measurement patterns, then after taking a tiny shot at the measurement pattern area adjacent to the formed measurement pattern opposite to the lastly-formed measurement pattern in the same line, moving the charged particle beam to a next measurement pattern area to be drawn located in a line adjacent to the measurement pattern area adjacent to the formed measurement pattern, and then forming a next measurement pattern area in the adjacent line.

* * * * *